United States Patent
Hagleitner et al.

(10) Patent No.: US 7,492,301 B1
(45) Date of Patent: Feb. 17, 2009

(54) LOW POWER TO ANALOG TO DIGITAL CONVERTER WITH SMALL INPUT CAPACITANCE

(75) Inventors: Christoph Hagleitner, Zug (CH); Christian I. Menolfi, Langnau am Albis (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/181,506

(22) Filed: Jul. 29, 2008

(51) Int. Cl.
*H03M 1/12* (2006.01)
(52) U.S. Cl. .................................... 341/155
(58) Field of Classification Search ................ 341/155, 341/156, 158, 159
See application file for complete search history.

(56) References Cited

U.S. PATENT DOCUMENTS

| | | | |
|---|---|---|---|
| 4,553,052 A | * | 11/1985 | Takahashi ..................... 327/65 |
| 5,990,814 A | * | 11/1999 | Croman et al. .............. 341/118 |
| 6,445,329 B1 | | 9/2002 | Abassi et al. |
| 2006/0114140 A1 | | 6/2006 | Hsueh |
| 2006/0146958 A1 | * | 7/2006 | Doi ............................ 375/318 |

OTHER PUBLICATIONS

Toifl et al., "A 22-Gb/s PAM-4 Receiver in 90-nm CMOS SOI Technology", IEEE Journal of Solid-State Circuits, vol. 41, No. 4, Apr. 2006, pp. 954-965.

\* cited by examiner

*Primary Examiner*—Howard Williams
(74) *Attorney, Agent, or Firm*—Duke W. Yee; Jesse Abzug; James O. Skarsten

(57) ABSTRACT

According to one embodiment of the present invention an analog to digital converter comprises a track and hold unit, a plurality of current-integrating voltage shifters connected to the track and hold unit, a plurality of latches connected to the plurality of current-integrating voltage shifters, wherein a voltage offset of each latch in the plurality of latches is adjustable, wherein each current-integrating voltage shifter in the plurality of current-integrating voltage shifters drives a latch of the plurality of latches, wherein each current-integrating voltage shifter in the plurality of current-integrating voltage shifters corresponds to a voltage range, and wherein each latch connected to a current-integrating voltage shifter corresponds to a portion of the voltage range of the current-integrating voltage shifter.

1 Claim, 3 Drawing Sheets

LOW POWER TO ANALOG TO DIGITAL CONVERTER WITH SMALL INPUT CAPACITANCE

BACKGROUND OF THE INVENTION

1. Field of the Invention

The present invention relates generally to analog to digital converters and more specifically to analog to digital conversions at high speed.

2. Description of the Related Art

Analog to Digital Converters (ADCs) are now slowly entering the field of high-speed chip-to-chip links, where they were previously forbidden due to their large power and high input capacitance. Also, the implementation of sophisticated coding schemes in data communication requires the use of an ADC at the receiver side.

BRIEF SUMMARY OF THE INVENTION

According to one embodiment of the present invention an analog to digital converter comprises a track and hold unit, a plurality of current-integrating voltage shifters connected to the track and hold unit, a plurality of latches connected to the plurality of current-integrating voltage shifters, wherein a voltage offset of each latch in the plurality of latches is adjustable, wherein each current-integrating voltage shifter in the plurality of current-integrating voltage shifters drives a latch of the plurality of latches, wherein each current-integrating voltage shifter in the plurality of current-integrating voltage shifters corresponds to a voltage range, and wherein each latch connected to a current-integrating voltage shifter corresponds to a portion of the voltage range of the current-integrating voltage shifter.

DETAILED DESCRIPTION OF THE INVENTION

In the case of high-speed serial links, the analog to digital converter must fulfill the following requirements: high conversion rate, such as several giga samples per second; several bits of resolution, such as four to eight bits; a low input capacitance; and a low power consumption.

Exemplary embodiments employ an analog to digital converter architecture that includes a track and hold stage, followed by a plurality of integrating shifters, each of which drives a plurality of offset-adjustable latches. Thus, exemplary embodiments satisfy the four requirements stated above.

Figure 1:
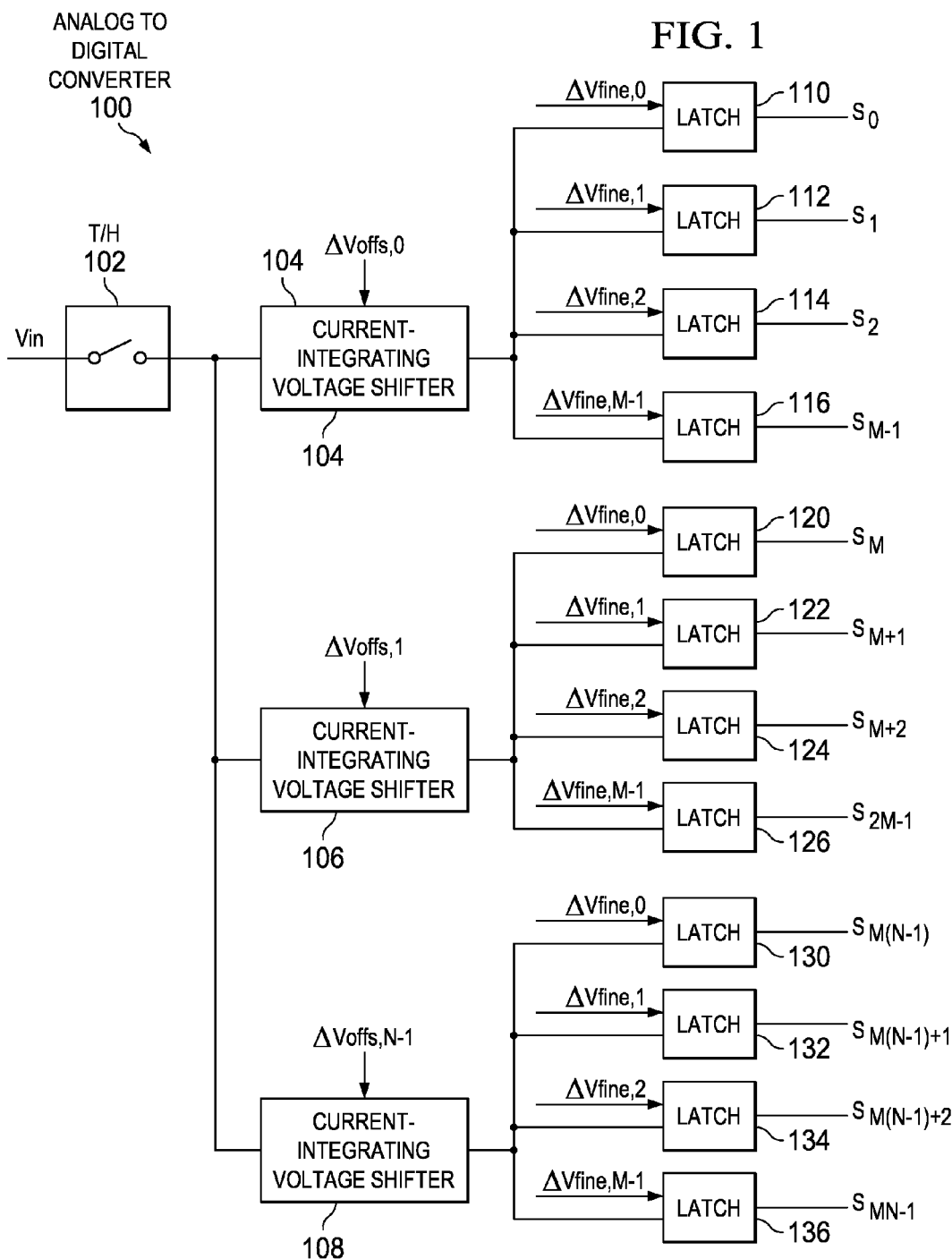
FIG. 1 is a block diagram of an analog to digital converter in accordance with an exemplary embodiment.

FIG. 1 is a block diagram of an analog to digital converter in accordance with an exemplary embodiment. Analog to digital converter 100 comprises a track and hold module, T/H 102, current-integrating voltage shifters 104, 106, and 108, each of which drives a plurality of latches that have a voltage offset capability, latches 110, 112, 114, 116, 120, 122, 124, 126, 130, 132, 134, and 136. Each current-integrating voltage shifter corresponds to a voltage range. Each latch corresponds to a portion of the voltage range of the current-integrating voltage shifter that drives the latch. Current-integrating voltage shifter 104 drives latches 110, 112, 114, and 116. Current-integrating voltage shifter 106 drives latches 120, 122, 124, and 126. Current-integrating voltage shifter 108 drives latches 130, 132, 134, and 136. Current-integrating voltage shifters 104, 106, and 108 may each be implemented as either a voltage shifter or as a buffer. It should be noted that while the present example depicts three current-integrating voltage shifters, this is only shown as an example and is not meant to limit the architecture of exemplary embodiments to the architecture shown. Exemplary embodiments contemplate analog to digital converter 100 implemented with any number of current-integrating voltage shifters. A current-integrating voltage shifter is also known as a capacitive voltage buffer and a capacitive voltage shifter.

It should be noted that while the present example depicts each current-integrating voltage shifter as driving four latches, this is only shown as an example and is not meant in to limit the architecture of exemplary embodiments to the architecture shown. A current-integrating voltage shifter could drive any number of latches. Further, each current-integrating voltage shifter could drive a different number of latches than other current-integrating voltage shifters in the analog to digital converter. In an exemplary embodiment, each current-integrating voltage shifter drives only one latch.

Each current-integrating voltage shifter corresponds to a specific voltage range of the input voltage. T/H 102 samples the input voltage, $V_{in}$, and thus defines the timing of analog to digital converter 100. The track and hold module, T/H 102, is followed by a plurality, N, of capacitive voltage shifters. Each current-integrating voltage shifter receives an offset voltage. Each current-integrating voltage shifter adds a coarse offset voltage $\Delta_{Voffs}$ to the sampled input voltage $V_{in}$ and drives a number of M offset-adjustable sampling latches. Current-integrating voltage shifter 104 receives input offset voltage $\Delta_{Voffs}$, 0. Current-integrating voltage shifter 106 receives input offset voltage $\Delta_{Voffs}$, 1. Current-integrating voltage shifter 108 receives input offset voltage $\Delta_{Voffs}$, N−1. The plurality, M, of latches that have a voltage offset capability, latches 110, 112, 114, 116, 120, 122, 124, 126, 130, 132, 134, and 136, fine tune the sampled input voltage $V_{in}$ by adding an additional offset voltage, designated as $\Delta V_{fine}$ M, and derive a decision bit $S_i$ (i=0 ... MN−1) if the resulting voltage is higher or lower than zero, provided that differential signaling is used. The voltage offset, $\Delta V_{fine}$ M supplied to each latch is adjustable and corresponds to a portion of the voltage range covered by the current-integrating voltage shifter that drives the latch.

Thus, the presented ADC defines the decision threshold levels by the sum of $\Delta Voffs,n + \Delta Fine,m$, where n=0 ... N−1 and m=0 ... M−1, which results in a total number N*M threshold levels corresponding to a maximum ADC resolution of log(N*M) bits.

Thus, an analog to digital converter in accordance with an exemplary embodiments comprises a track and hold unit, a plurality of current-integrating voltage shifters connected to the track and hold unit, a plurality of latches connected to the plurality of current-integrating voltage shifters, wherein a voltage offset of each latch in the plurality of latches is adjustable, wherein each current-integrating voltage shifter in the plurality of current-integrating voltage shifters drives a latch of the plurality of latches, wherein each current-integrating voltage shifter in the plurality of current-integrating voltage shifters corresponds to a voltage range; and wherein each latch connected to a current-integrating voltage shifter corresponds to a portion of the voltage range of the current-integrating voltage shifter.

Figure 2:
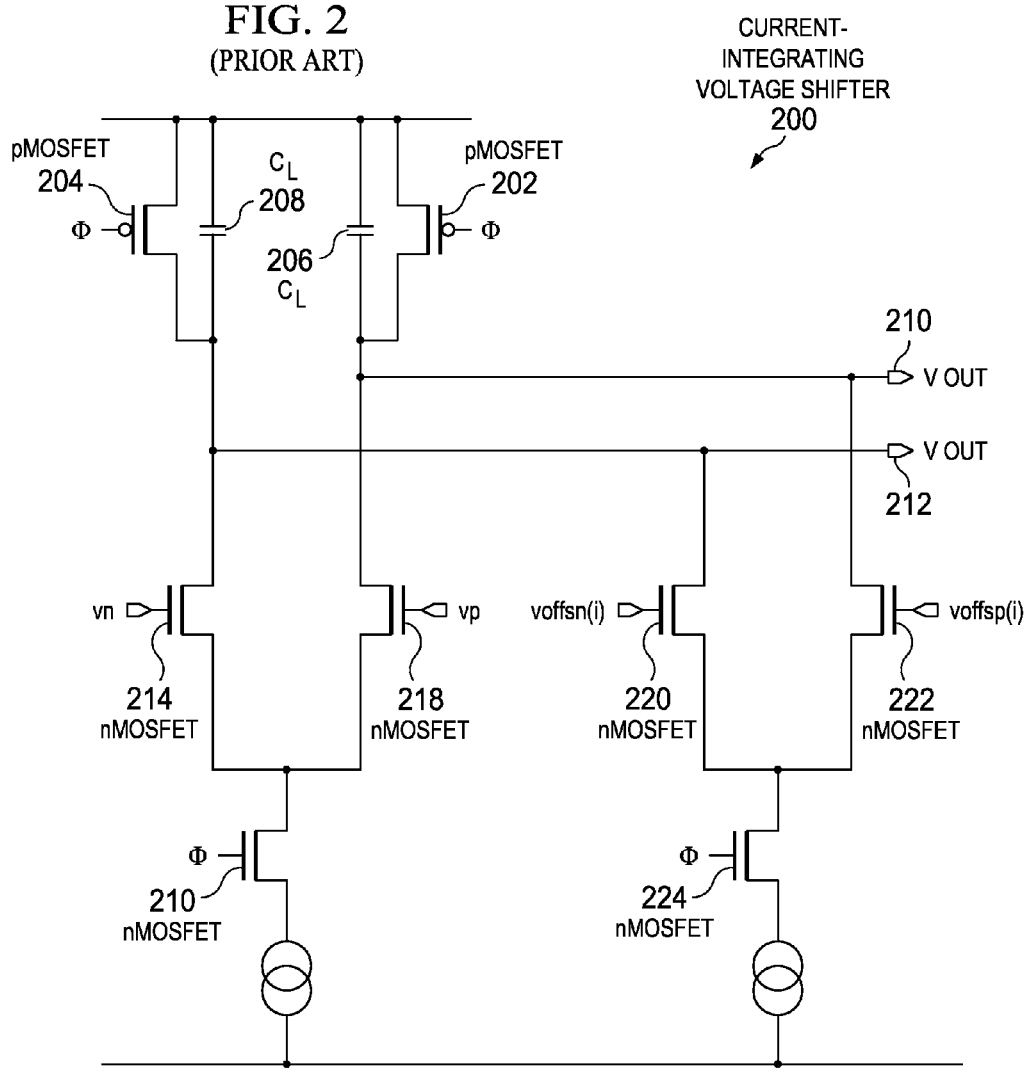
FIG. 2 is a diagram of a prior art current integrating shifter with offset voltage adder.

FIG. 2 is a diagram of a prior art current integrating shifter with offset voltage adder. Current-integrating voltage shifter 200 may be implemented as a capacitive voltage shifter 104 in FIG. 1. Current-integrating voltage shifter 200 comprises a pair of p-type metal-oxide-semiconductor field-effect transistors (pMOSFET), pMOSFETs 202 and 204, a pair of load capacitors, $C_L$ 206 and 208, two voltage outputs, vout 210 and 212, six n-type metal-oxide-semiconductor field-effect transistors (nMOSFET), nMOSFETs 214, 216, 218, 220, 222, and 224, a pair of sampled voltage inputs, positive and negative, vp and vn, and a pair of offset voltage inputs, positive and negative, voffsp(i) and voffsn(i).

Current-integrating voltage shifter 200 has two cycles, one in which the clock signal is high, the second in which the clock signal is low. In the first cycle, when the clock φ is high, the input voltage, held constant by the track and hold module, is integrated on the load capacitors $C_L$, plus an offset voltage, thereby providing amplification proportional to the integration time. In the second cycle, when φ is low, the output voltage nodes are reset, which erases the memory of the previous state.

The amplification of the circuit is given by $$\frac{\Delta V}{Vin} = g_m \frac{\Delta t}{C_L}, \quad (1)$$

where $g_m$ is the transconductance of the transistors in the differential pair, $C_L$ is the overall load capacitance of the stage, and $\Delta t$ is the integration period, which is related to the conversion frequency $f_c$ by $$\Delta t = \frac{1}{2 f_c}. \quad (2)$$

The benefit of the integrating shifter can immediately seen by setting the voltage gain in equation (1) to unity and calculating the ratio of the capacitance seen at the input of the stage $C_g$, and the load capacitance $C_L$ $$\frac{C_L}{C_g} = \frac{f_t}{2 f_c}, \text{ where } f_t = \frac{g_m}{C_g}$$

is the transit frequency of the transistor in the specific bias point. Hence, insertion of the integrating shifter reduces the capacitive input load by the factor given in paragraph.

Figure 3:
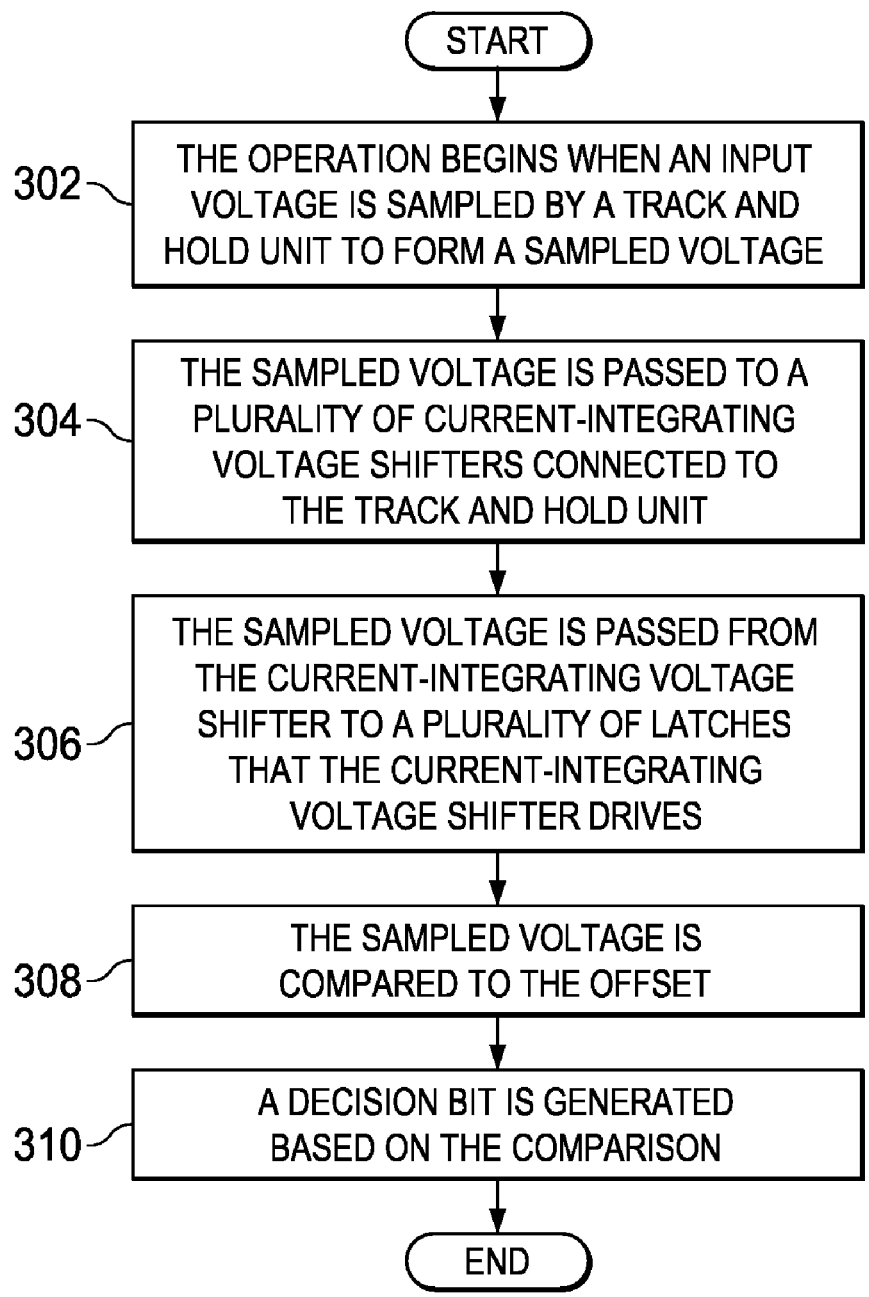
FIG. 3 is a flowchart illustrating the operation of an analog to digital converter in accordance with an exemplary embodiment.

FIG. 3 is a flowchart illustrating the operation of an analog to digital converter in accordance with an exemplary embodiment. The operation of FIG. 3 may be performed in an analog to digital converter, such as analog to digital converter 100 in FIG. 1. The operation begins when an input voltage is sampled by a track and hold unit to form a sampled voltage (step 302). The sampling determines the timing of the digital to analog converter. The sampled voltage is passed to a plurality of current-integrating voltage shifters connected to the track and hold unit (step 304). Each current-integrating voltage shifter in the plurality of current-integrating voltage shifters corresponds to a voltage range. Each current-integrating voltage shifter in the plurality of current-integrating voltage shifters receives a separate offset voltage. Each current-integrating voltage shifter in the plurality of current-integrating voltage shifters drives a plurality of latches. The sampled voltage is passed from the current-integrating voltage shifter to a plurality of latches that the current-integrating voltage shifter drives (step 306). Each latch connected to a current-integrating voltage shifter corresponds to a portion of the voltage range of the current-integrating voltage shifter. Each latch receives an offset voltage, wherein the voltage offset of each latch in the plurality of latches is adjustable. The sampled voltage is compared to the offset (step 308) and a decision bit is generated based on the comparison (step 310) and the operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An analog to digital converter comprising:
 a track and hold unit;
 a plurality of current-integrating voltage shifters connected to the track and hold unit;
 a plurality of latches connected to the plurality of current-integrating voltage shifters, wherein a voltage offset of each latch in the plurality of latches is adjustable;
 wherein each current-integrating voltage shifter in the plurality of current-integrating voltage shifters drives a latch of the plurality of latches;
 wherein each current-integrating voltage shifter in the plurality of current-integrating voltage shifters corresponds to a voltage range; and
 wherein each latch connected to a current-integrating voltage shifter corresponds to a portion of the voltage range of the current-integrating voltage shifter.

* * * * *